(12) United States Patent
Sella et al.

(10) Patent No.: US 8,476,524 B2
(45) Date of Patent: Jul. 2, 2013

(54) ELECTRICALLY ISOLATED HEAT DISSIPATING JUNCTION BOX

(75) Inventors: Guy Sella, Beit Aharon (IL); Lior Handelsman, Givataim (IL); Vadim Shmukler, Rishon-Lezion (IL); Meir Adest, Raanana (IL); Meir Gazit, Ashkelon (IL); Yoav Galin, Raanana (IL)

(73) Assignee: Solaredge Technologies Ltd., Hod Hasharon (IL)

( * ) Notice: Subject to any disclaimer, the term of this patent is extended or adjusted under 35 U.S.C. 154(b) by 152 days.

(21) Appl. No.: 12/785,773

(22) Filed: May 24, 2010

(65) Prior Publication Data
US 2010/0294528 A1 Nov. 25, 2010

Related U.S. Application Data

(60) Provisional application No. 61/180,455, filed on May 22, 2009.

(51) Int. Cl.
*H05K 5/06* (2006.01)
(52) U.S. Cl.
USPC .............. 174/50; 439/535; 248/906
(58) Field of Classification Search
USPC ..... 174/50; 439/535, 709, 142, 718; 248/906; 220/4.02; 136/244
See application file for complete search history.

(56) References Cited

U.S. PATENT DOCUMENTS

| | | | |
|---|---|---|---|
| 3,369,210 A | 2/1968 | Manickella |
| 3,596,229 A | 7/1971 | Hohorst |
| 4,171,861 A | 10/1979 | Hohorst |
| 4,452,867 A | 6/1984 | Conforti |
| 4,460,232 A | 7/1984 | Sotolongo |
| 4,623,753 A | 11/1986 | Feldman et al. |

(Continued)

FOREIGN PATENT DOCUMENTS
CN 201008026 1/2008
DE 202009001918 U 7/2009

(Continued)

OTHER PUBLICATIONS

Combined search and examination report—GB1107241.0—Dated Sep. 5, 2011.

(Continued)

*Primary Examiner* — Dhirubhai R Patel
(74) *Attorney, Agent, or Firm* — Banner & Witcoff, Ltd.

(57) ABSTRACT

A junction box used for making electrical connections to a photovoltaic panel. The junction box has two chambers including a first chamber and a second chamber and a wall common to and separating both chambers. The wall may be adapted to have an electrical connection therethrough. The two lids are adapted to seal respectively the two chambers. The two lids are on opposite sides of the junction box relative to the photovoltaic panel. The two lids may be attachable using different sealing processes to a different level of hermeticity. The first chamber may be adapted to receive a circuit board. The junction box may include supports for mounting a printed circuit board in the first chamber. The second chamber is configured for electrical connection to the photovoltaic panel. A metal heat sink may be bonded inside the first chamber. The first chamber is adapted to receive a circuit board for electrical power conversion, and the metal heat sink is adapted to dissipate heat generated by the circuit board.

23 Claims, 4 Drawing Sheets

U.S. PATENT DOCUMENTS

| | | |
|---|---|---|
| 4,637,677 A | 1/1987 | Barkus |
| 4,641,079 A | 2/1987 | Kato et al. |
| 4,783,728 A | 11/1988 | Hoffman |
| 4,903,851 A | 2/1990 | Slough |
| 4,987,360 A | 1/1991 | Thompson |
| 5,045,988 A | 9/1991 | Gritter et al. |
| 5,280,232 A | 1/1994 | Kohl et al. |
| 5,460,546 A | 10/1995 | Kunishi et al. |
| 5,497,289 A | 3/1996 | Sugishima et al. |
| 5,548,504 A | 8/1996 | Takehara |
| 5,604,430 A | 2/1997 | Decker et al. |
| 5,646,501 A | 7/1997 | Fishman et al. |
| 5,773,963 A | 6/1998 | Blanc et al. |
| 5,780,092 A | 7/1998 | Agbo et al. |
| 5,798,631 A | 8/1998 | Spee et al. |
| 5,801,519 A | 9/1998 | Midya et al. |
| 5,804,894 A | 9/1998 | Leeson et al. |
| 5,821,734 A | 10/1998 | Faulk |
| 5,822,186 A | 10/1998 | Bull et al. |
| 5,838,148 A | 11/1998 | Kurokami et al. |
| 5,869,956 A | 2/1999 | Nagao et al. |
| 5,873,738 A | 2/1999 | Shimada et al. |
| 5,892,354 A | 4/1999 | Nagao et al. |
| 5,923,158 A | 7/1999 | Kurokami et al. |
| 5,945,806 A | 8/1999 | Faulk |
| 5,963,010 A | 10/1999 | Hayashi et al. |
| 5,990,659 A | 11/1999 | Frannhagen |
| 6,031,736 A | 2/2000 | Takehara et al. |
| 6,038,148 A | 3/2000 | Farrington et al. |
| 6,046,919 A | 4/2000 | Madenokouji et al. |
| 6,050,779 A | 4/2000 | Nagao et al. |
| 6,082,122 A | 7/2000 | Madenokouji et al. |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,145,264 A | 11/2000 | Dallaire |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,259,234 B1 | 7/2001 | Perol |
| 6,262,558 B1 | 7/2001 | Weinberg |
| 6,285,572 B1 | 9/2001 | Onizuka et al. |
| 6,320,769 B2 | 11/2001 | Kurokami et al. |
| 6,339,538 B1 | 1/2002 | Handleman |
| 6,493,246 B2 | 12/2002 | Suzui et al. |
| 6,531,848 B1 | 3/2003 | Chitsazan et al. |
| 6,545,211 B1 | 4/2003 | Mimura |
| 6,548,205 B2 | 4/2003 | Leung et al. |
| 6,590,793 B1 | 7/2003 | Nagao et al. |
| 6,608,468 B2 | 8/2003 | Nagase |
| 6,611,441 B2 | 8/2003 | Kurokami et al. |
| 6,672,018 B2 | 1/2004 | Shingleton |
| 6,678,174 B2 | 1/2004 | Suzui et al. |
| 6,690,590 B2 | 2/2004 | Stamenic et al. |
| 6,738,692 B2 | 5/2004 | Schienbein et al. |
| 6,768,047 B2 | 7/2004 | Chang et al. |
| 6,788,033 B2 | 9/2004 | Vinciarelli |
| 6,795,318 B2 | 9/2004 | Haas et al. |
| 6,801,442 B2 | 10/2004 | Suzui et al. |
| 6,914,418 B2 | 7/2005 | Sung |
| 6,919,714 B2 | 7/2005 | Delepaut |
| 6,936,995 B2 | 8/2005 | Kapsokavathis et al. |
| 6,963,147 B2 | 11/2005 | Kurokami et al. |
| 6,984,970 B2 | 1/2006 | Capel |
| 7,030,597 B2 | 4/2006 | Bruno et al. |
| 7,031,176 B2 | 4/2006 | Kotsopoulos et al. |
| 7,042,195 B2 | 5/2006 | Tsunetsugu et al. |
| 7,046,531 B2 | 5/2006 | Zocchi et al. |
| 7,053,506 B2 | 5/2006 | Alonso et al. |
| 7,072,194 B2 | 7/2006 | Nayar et al. |
| 7,079,406 B2 | 7/2006 | Kurokami et al. |
| 7,087,332 B2 | 8/2006 | Harris |
| 7,090,509 B1 | 8/2006 | Gilliland et al. |
| 7,091,707 B2 | 8/2006 | Cutler |
| 7,097,516 B2 * | 8/2006 | Werner et al. ............... 439/709 |
| 7,126,053 B2 | 10/2006 | Kurokami et al. |
| 7,126,294 B2 | 10/2006 | Minami et al. |
| 7,148,669 B2 | 12/2006 | Maksimovic et al. |
| 7,291,036 B1 | 11/2007 | Daily et al. |
| 7,385,833 B2 | 6/2008 | Keurig |
| 7,420,815 B2 | 9/2008 | Love |
| 7,435,134 B2 | 10/2008 | Lenox |
| 7,435,897 B2 | 10/2008 | Russell |
| 7,600,349 B2 | 10/2009 | Liebendorfer |
| 7,748,175 B2 | 7/2010 | Liebendorfer |
| 7,759,575 B2 * | 7/2010 | Jones et al. ............... 174/50 |
| 7,763,807 B2 * | 7/2010 | Richter ............... 174/138 F |
| 7,780,472 B2 | 8/2010 | Lenox |
| 7,900,361 B2 | 3/2011 | Adest et al. |
| 7,960,650 B2 * | 6/2011 | Richter et al. ............... 174/50 |
| 7,960,950 B2 | 6/2011 | Glovinsky |
| 8,003,885 B2 * | 8/2011 | Richter et al. ............... 174/50 |
| 8,004,117 B2 | 8/2011 | Adest et al. |
| 8,013,472 B2 | 9/2011 | Adest et al. |
| 8,111,052 B2 | 2/2012 | Glovinsky |
| 2003/0080741 A1 | 5/2003 | LeRow et al. |
| 2004/0201279 A1 | 10/2004 | Templeton |
| 2005/0057214 A1 | 3/2005 | Matan |
| 2005/0057215 A1 | 3/2005 | Matan |
| 2005/0068820 A1 | 3/2005 | Radosevich et al. |
| 2005/0172995 A1 | 8/2005 | Rohrig et al. |
| 2006/0001406 A1 | 1/2006 | Matan |
| 2006/0038692 A1 | 2/2006 | Schnetker |
| 2006/0108979 A1 | 5/2006 | Daniel et al. |
| 2006/0149396 A1 | 7/2006 | Templeton |
| 2006/0162772 A1 | 7/2006 | Presher, Jr. et al. |
| 2006/0174939 A1 | 8/2006 | Matan |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2007/0044837 A1 | 3/2007 | Simburger et al. |
| 2007/0147075 A1 | 6/2007 | Bang |
| 2007/0159866 A1 | 7/2007 | Siri |
| 2008/0097655 A1 | 4/2008 | Hadar et al. |
| 2008/0136367 A1 | 6/2008 | Adest et al. |
| 2008/0143188 A1 | 6/2008 | Adest et al. |
| 2008/0144294 A1 | 6/2008 | Adest et al. |
| 2008/0147335 A1 | 6/2008 | Adest et al. |
| 2008/0150366 A1 | 6/2008 | Adest et al. |
| 2008/0164766 A1 | 7/2008 | Adest et al. |
| 2008/0238195 A1 | 10/2008 | Shaver et al. |
| 2009/0039852 A1 | 2/2009 | Fishelov et al. |
| 2009/0084570 A1 * | 4/2009 | Gherardini et al. ............. 174/51 |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0206666 A1 | 8/2009 | Sella et al. |
| 2009/0237042 A1 | 9/2009 | Glovinsky |
| 2009/0237043 A1 | 9/2009 | Glovinsky |
| 2009/0273241 A1 | 11/2009 | Gazit et al. |
| 2009/0282755 A1 | 11/2009 | Abbott et al. |
| 2010/0124027 A1 | 5/2010 | Handelsman et al. |
| 2010/0269430 A1 | 10/2010 | Haddock et al. |
| 2010/0282290 A1 | 11/2010 | Schwarze et al. |
| 2010/0294903 A1 | 11/2010 | Shmukler et al. |
| 2010/0297860 A1 | 11/2010 | Shmukler et al. |
| 2010/0301991 A1 | 12/2010 | Sella et al. |
| 2011/0084553 A1 | 4/2011 | Adest et al. |
| 2011/0114154 A1 | 5/2011 | Lichy et al. |
| 2011/0121652 A1 | 5/2011 | Sella et al. |
| 2011/0125431 A1 | 5/2011 | Adest et al. |
| 2011/0133552 A1 | 6/2011 | Binder et al. |
| 2011/0140536 A1 | 6/2011 | Adest et al. |
| 2011/0181340 A1 | 7/2011 | Gazit |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0291486 A1 | 12/2011 | Adest et al. |
| 2012/0007613 A1 | 1/2012 | Gazit |

FOREIGN PATENT DOCUMENTS

| | | |
|---|---|---|
| EP | 0420295 | 4/1991 |
| EP | 0604777 | 7/1994 |
| EP | 1531545 | 5/2005 |
| EP | 1657797 | 5/2006 |
| EP | 1729369 | 12/2006 |
| EP | 2296188 | 3/2011 |
| ES | 2249147 | 3/2006 |
| JP | 2003134667 | 5/2003 |
| JP | 2007058845 | 3/2007 |
| WO | 9313587 | 7/1993 |
| WO | 9613093 | 5/1996 |
| WO | 9823021 | 5/1998 |
| WO | 03050938 | 6/2003 |
| WO | 03071655 | 8/2003 |
| WO | 2004023278 | 3/2004 |
| WO | 2004090993 | 10/2004 |
| WO | 2004107543 | 12/2004 |
| WO | 2005076445 | 8/2005 |
| WO | 2006078685 | 7/2006 |
| WO | 2007006564 | 1/2007 |
| WO | 2007084196 | 7/2007 |
| WO | 2007113358 | 10/2007 |
| WO | 2008057493 | 5/2008 |
| WO | 2010134057 A1 | 11/2010 |

OTHER PUBLICATIONS

PCT/IB2010/052287 International Search Report and Written Opinion.

International Search Report for PCT/IB2007/004610 dated Feb. 23, 2009.

International Search Report for PCT/IB2007/004584 dated Jan. 28, 2009.

International Search Report for PCT/IB2007/004586 dated Mar. 5, 2009.

International Search Report for PCT/IB2007/004643 dated Jan. 30, 2009.

International Search Report for PCT/US2008/085736 dated Jan. 28, 2009.

International Search Report for PCT/US2008/085754 dated Feb. 9, 2009.

International Search Report for PCT/US2008/085755 dated Feb. 3, 2009.

Knaupp, et al., "Operation of a 10 KW PV Façade with 100 W AC Photovoltaic Modules", 1996 IEEE, 25th PVSC, May 13-17, 1996, pp. 1235-1238, Washington, DC.

Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.

Alonso, "A New Distributed Converter Interface for PV Panels", 20th European Photovoltaic Solar Energy Conference, Jun. 6-10, 2005, Barcelona, Spain, pp. 2288-2291.

Enslin, "Integrated Photovoltaic Maximum Power Point Tracking Converter", IEEE Transactions on Industrial Electronics, vol. 44, No. 6, Dec. 1997, pp. 769-773.

Lindgren, "Topology for Decentralised Solar Energy Inverters with a Low Voltage AC-Bus", Chalmers University of Technology, Department of Electrical Power Engineering, EPE '99—Lausanne.

Palma, "A Modular Fuel Cell, Modular DC-DC Converter Concept for High Performance and Enhanced Reliability", IEEE 2007, pp. 2633-2638.

* cited by examiner

ELECTRICALLY ISOLATED HEAT DISSIPATING JUNCTION BOX

CROSS REFERENCE TO RELATED APPLICATIONS

This application claims benefit from U.S. patent application 61/180,455 filed May 22, 2009, the disclosure of which is incorporated herein by reference.

BACKGROUND

1. Technical Field

The present invention relates to a junction box for power sources, and specifically to a junction box for electrically connecting to a photovoltaic panel.

2. Description of Related Art

A photovoltaic module or photovoltaic panel is a packaged interconnected assembly of photovoltaic cells, also known as solar cells. Since a single photovoltaic module can only produce a limited amount of power, commercial installations include several modules or panels interconnected in serial and in parallel into a photovoltaic array. Electrical connections are made in series to achieve a desired output voltage and/or in parallel to provide a desired amount of current source capability. A photovoltaic installation typically includes the array of photovoltaic modules, an inverter, batteries and interconnection wiring.

When part of a photovoltaic module is shaded, the shaded cells do not produce as much current as the unshaded cells. Since photovoltaic cells are connected in series, the same amount of current must flow through every serially connected cell. The unshaded cells force the shaded cells to pass more current. The only way the shaded cells can operate at a higher current is to operate in a region of negative voltage that is to cause a net voltage loss to the system. The current times this negative voltage gives the negative power produced by the shaded cells. The shaded cells dissipate power as heat and cause "hot spots". Bypass diodes are therefore integrated with the photovoltaic modules to avoid overheating of cells in case of partial shading of the photovoltaic module.

Blocking diodes may be placed in series with cells or modules to block reverse leakage current backwards through the modules such as to block reverse flow of current from a battery through the module at night or to block reverse flow down damaged modules from parallel-connected modules during the day.

Electronic modules may be integrated with the photovoltaic modules which perform electrical conversion, e.g. direct current (DC) to direct current conversion, electrical inversion, e.g. micro-inverter, or other functions such as monitoring of performance and/or protection against theft.

U.S. Pat. No. 7,291,036 discloses a photovoltaic connection system including a connection box with for surface mounted diodes mounted on a printed circuit board inside of the connection box. The connection box optionally includes a metal plate mounted inside the lid of the connection box as a heat sink for dissipating heat from the diodes.

The term "cable gland" as used herein refers to a device used for the entry of electrical cables or cords into electrical equipment and is used to firmly secure an electrical cable entering a piece of electrical equipment.

The term "in situ" in the context of the present invention refers to bonding or attaching during manufacture, e.g. injection molding, of a part as opposed to attaching after manufacture of the part.

BRIEF SUMMARY

According to an aspect of the present invention there is provided a junction box used for making electrical connections to a photovoltaic panel. The junction box has two chambers including a first chamber and a second chamber and a wall common to and separating both chambers. The wall may be adapted to have an electrical connection therethrough. The two lids are adapted to seal respectively the two chambers. The two lids are configured to be on opposite sides of the junction box relative to the photovoltaic panel. The two lids may be attachable using different sealing processes. One of the lids may be adapted to seal the first chamber and the other lid may seal the second chamber to a different level of hermeticity from that of the first chamber. The first chamber may be adapted to receive a circuit board for electrical power conversion of the power output of the photovoltaic panel. The junction box may include supports for mounting a printed circuit board in the first chamber. The second chamber is configured for electrical connection to the photovoltaic panel. The second chamber may optionally be configured to include diodes, e.g. bypass and/or blocking diodes. The junction box may have electrical connection terminals mounted inside the second chamber for connecting a circuit to the photovoltaic panel. A metal heat sink may be bonded inside the first chamber. The first chamber is adapted to receive a circuit board for electrical power conversion, and the metal heat sink is adapted to dissipate heat generated by the circuit board. The heat sink is placed inside an injection mold during manufacture of the junction box. The junction box may further include a pad adapted to provide thermal conduction and electrical insulation between the circuit board and the metal heat sink. The metal heat sink may include a dovetail structure adapted to prevent mutual separation of the metal heat sink from the junction box. The dovetail structure may be hollow.

According to an aspect of the present invention there is provided a junction box used for making electrical connections to a photovoltaic panel. The junction box has a metal heat sink bonded in situ inside the first chamber. The first chamber is adapted to receive a circuit board for electrical power conversion, and the metal heat sink is adapted to dissipate heat generated by the circuit board. The junction box optionally may have two chambers including a first chamber and a second chamber and a wall common to and separating both chambers. Two lids may be adapted to seal respectively the two chambers. The metal heat sink may include a dovetail structure adapted to prevent mutual separation of the metal heat sink from the junction box. The wall may have an electrical connection therethrough.

BRIEF DESCRIPTION OF THE DRAWINGS

Aspects of the invention is herein described, by way of example only, with reference to the accompanying drawings, wherein.

Figure 1A:
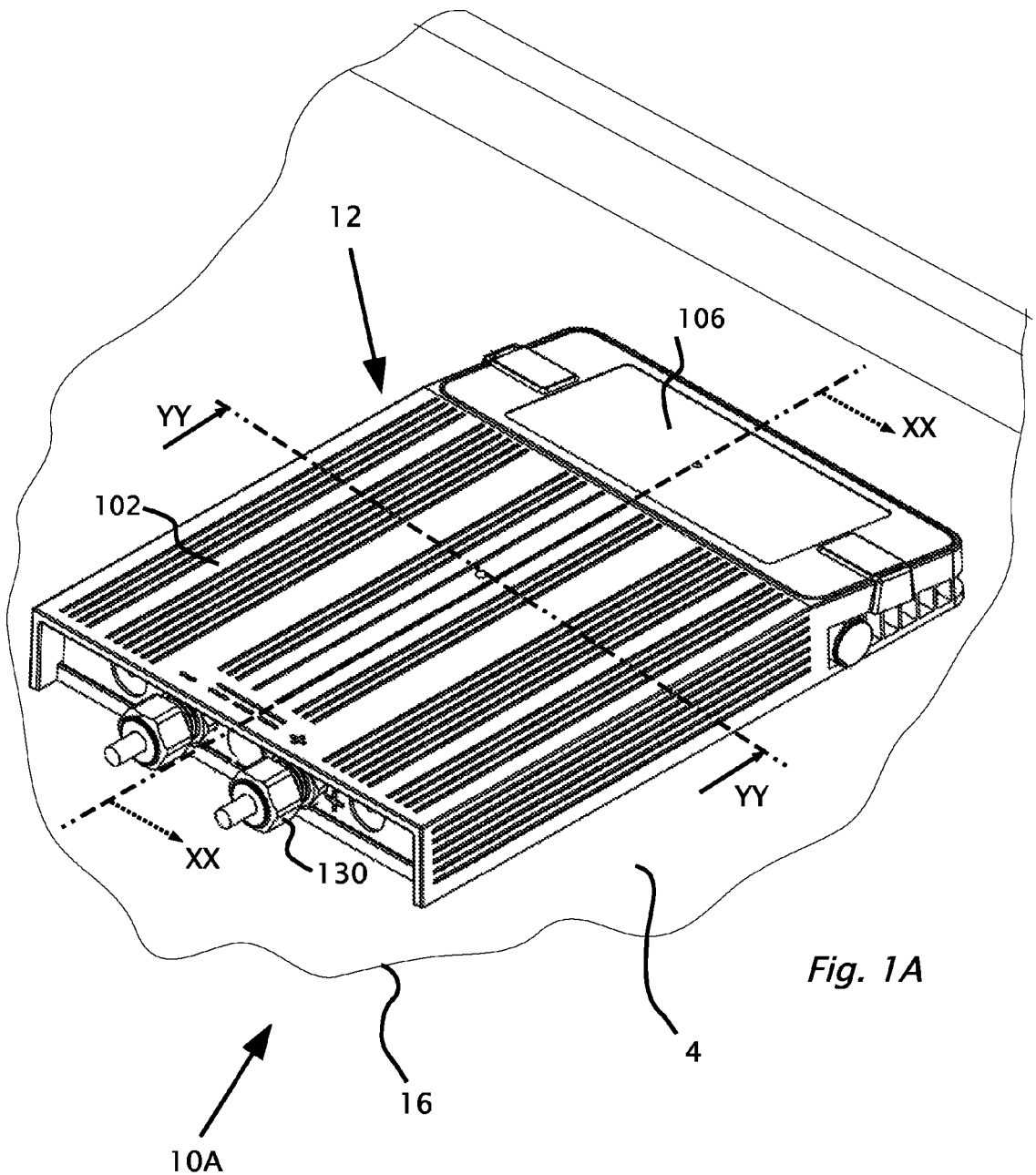
FIGS. 1A and 1B illustrate isometric views of a junction box, according to an embodiment of the present invention.

The foregoing and/or other aspects will become apparent from the following detailed description when considered in conjunction with the accompanying drawing figures.

DETAILED DESCRIPTION

Reference will now be made in detail to embodiments of the present invention, examples of which are illustrated in the accompanying drawings, wherein like reference numerals refer to the like elements throughout. The embodiments are described below to explain the present invention by referring to the figures.

By way of introduction, diodes and/or electronic modules within junction boxes attached to the photovoltaic modules dissipate heat. When insulating junction boxes are used, heat must be dissipated mostly through air inside the junction box. When metallic junction boxes are used then heat may be dissipated directly through the junction box. However, the use of a metallic junction boxes may be inconvenient because of regulations which require accessible metallic surfaces to be grounded and extra wiring is required.

Before explaining exemplary embodiments of the invention in detail, it is to be understood that the invention is not limited in its application to the details of design and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Referring now to the drawings, FIG. 1A shows an isometric view 10A of a junction box 12, according to an embodiment of the present invention. Junction box 12 is shown mounted on the back (or non-photovoltaic side) 4 of a photovoltaic panel 16. Junction box 12 has cable glands 130 which allow for termination of cables inside of junction box 12. Junction box 12 has an outer casing 102 and an access into junction box 12 using a lid 106.

Figure 1B:
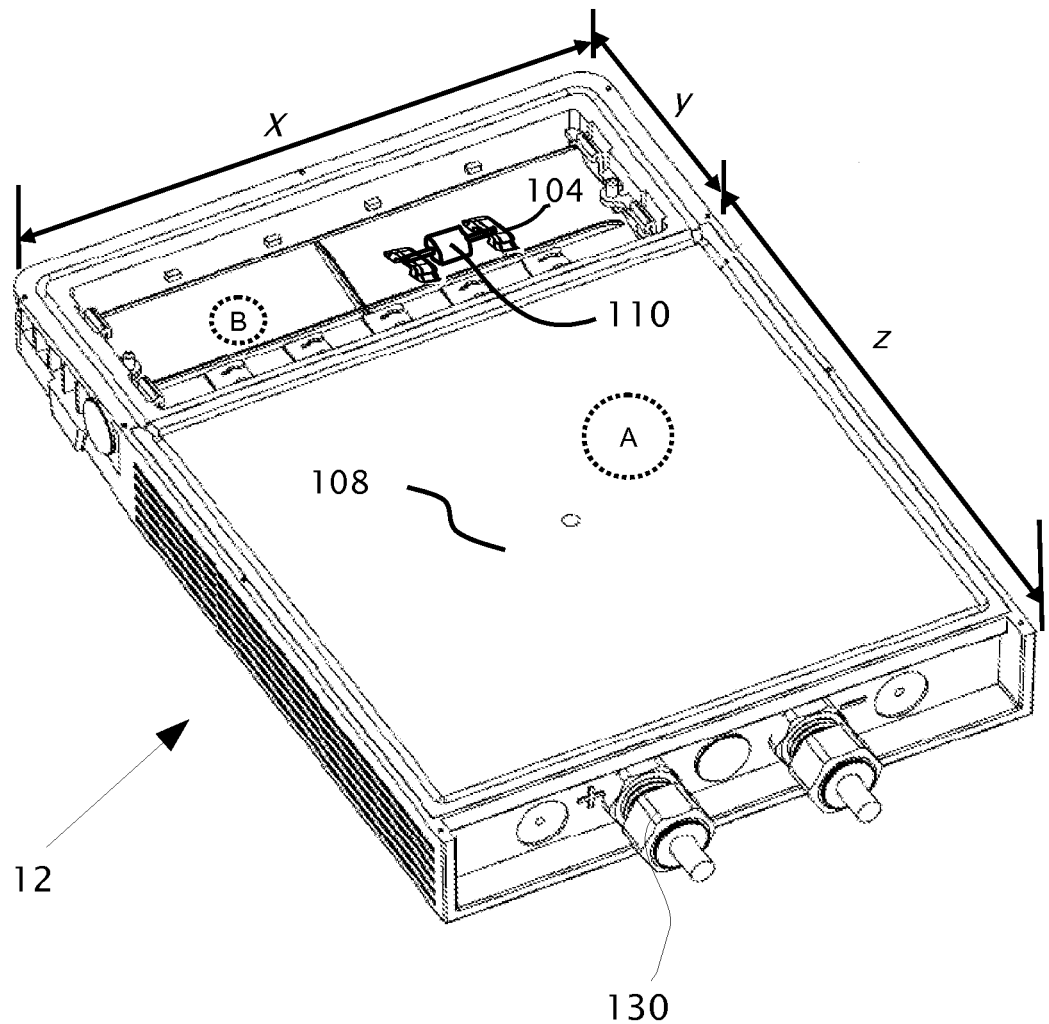

FIG. 1B shows an isometric view of the underside of junction box 12 detached from photovoltaic panel 16. The isometric view shows glands 130 and two sections A and B of junction box 12. chamber A is bounded by the dimensions Z×X with chamber A covered by lid 108. Lid 108 gives access into chamber A of junction box 12. Chamber B is an open section which is bounded by dimensions X×Y and shows terminals 104. A bypass diode 110 is connected between terminals 104. According to a feature of the present invention, lid 106 removed to access chamber B and lid 108 used to access chamber A are on opposite sides of junction box 12.

Figure 2A:
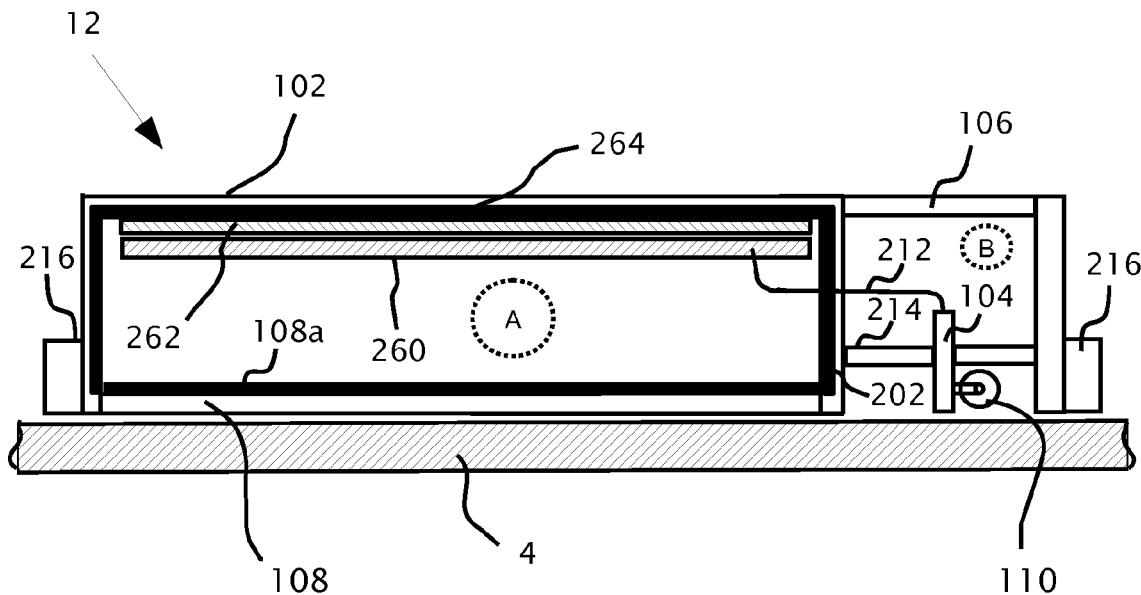
FIG. 2A shows details of cross section of the junction box indicated by dotted line XX in FIG. 1A.

FIG. 2A shows details of cross section XX of junction box 12 indicated by dotted line in FIG. 1A, showing features of the present invention. Cross section XX shows chamber sections A and B of junction box 12 mounted on non-photovoltaic side 4 of photovoltaic panel 16 with clips 216. The mechanical attachment between junction box 12 and photovoltaic panel 16 using clips 216 is such that junction box 12 is flat on photovoltaic panel 16 and a gasket may be used to seal the open end of chamber B.

Chamber A includes circuit board 260, thermally conductive pad 262, heat sink 264, outer casing 102 and lid 108. Circuit board 260 is preferably mounted on supports adapted to receive circuit board 260. Thermal pad 262 provides electrical isolation and thermal conductivity between heat sink 264 and circuit board 260. The component side of circuit board 260 is preferably in contact with thermal pad 262 so that heat created by the components of circuit board 260 is dissipated by heat sink 264 via thermal pad 262. Radio Frequency Interference (RFI) emission from junction box 12 as a result of the operation of circuit board 260 is reduced by having the side of lid 108 coated in an electrically conductive shielding 108a. Shielding 108a connects electrically to heat sink 264 to form a Faraday cage which suppresses RFI emission from junction box 12.

Lid 108 according to an aspect of the present invention is preferably manufactured by an injection molding process. During the injection molding process of lid 207 a shield 108a may be placed in situ and bonded to lid 108 during the injection molding process. Thus, when lid 108 is attached to box chamber A; junction box 12 is electrically isolated by heat sink 264 and shield 108a. Outer casing 102 and lid 108 additionally provide a non-electrically conductive isolation of heat sink 264 and shield 108a between the backside 4 of panel 16 and the exterior of junction box 12. Lid 108 is optionally permanently and/or hermetically sealed to chamber A.

Chamber B includes terminal 104, support 214, bypass diode 110, lid 106, bus bar 212 and wall 202. Wall 202 provides physical separation between chambers A and B. Electrical connectivity between circuit board 260 in chamber A and electrical connector 104 in chamber B is via bus bar 212. Bus bar 212 is sealed in wall 202 in such a way as to preserve the desired hermeticity of chamber A for example against the ingress of water or humidity. Both electrical connector 104 and bus bar 212 are supported mechanically by support 214. Support 214 may also provide hermetic sealing and/or electrical isolation between one end of connector 104 which connects to bus bar 212 and the other end of connector 104 which connects to connections provided by photovoltaic panel 16. Bypass diode 110 connected to connector 104 may be located between support 214 or backside 4 of panel 16 or between support 214 and lid 106. Lid 106 gives access to chamber B whilst junction box 12 is physically attached photovoltaic panel 16 but electrically isolated from panel 16. A preferred mechanism of attaching lid 106 to junction box 12 is to use a rubber gasket arrangement such that chamber B is hermetically sealed against for example the ingress of water/humidity through lid 106 into chamber B.

According to another embodiment of the present invention, junction box 12 is constructed with a double wall 202 so that chamber A and chamber B are mutually separable and re-attachable. Similarly, bus bar 212 is re-connectable between chamber A and chamber B. In this embodiment, a failure within the electronics of circuit board 260 may be repaired by replacing chamber A with a new circuit board 260 without requiring disconnection of chamber B from photovoltaic panel 16. Similarly, an electronics upgrade may be easily achieved.

Junction box 12 including casing 102, lids 108/106, heat sink 264, and thermal pad 262 are preferably adapted to comply with temperature and insulation standard of IEC 61215 (Ed. 2) or other applicable industry standards for use with connection to photovoltaic panels. Junction box 12 and lids 108/106 may be manufactured by injection molding of acrylonitrile butadiene styrene (ABS) thermoplastic, Polybutylene terephthalate (PBT), Poly(p-phenylene oxide) (PPO) or a thermoset such as epoxy resin.

Figure 2B:
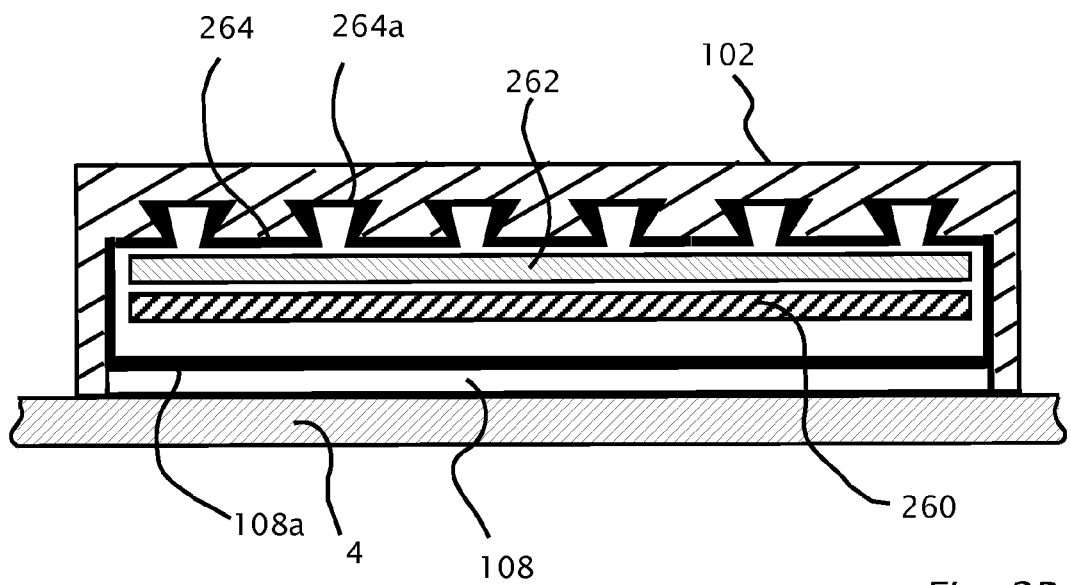
FIG. 2B shows details of cross section YY of the junction box indicated by dotted line in FIG. 1A.

FIG. 2B shows details of cross section YY of junction box 12 indicated by dotted line in FIG. 1A, according to an embodiment of the present invention. Cross section YY is of chamber A mounted on backside 4 of photovoltaic panel 16. Cross section YY shows outer casing 102, heat sink 264 with dovetail structure 264a, thermally conductive pad 262, circuit board 260 and lid 108 with electrical shield 108a.

The manufacture of box chamber sections A and B of junction box 12 in a preferred embodiment of the present invention is by an injection molding process. During the injection molding process heat sink 264 with or without dovetail structure 264a is placed inside box chamber A and is bonded in situ to box chamber A as a result of the injection molding process.

Additional strength of the bonding between heat sink 264 and box chamber A may be provided by a dovetail structure 264a which may be an integral part of heat sink 264. A further function of dovetail structure 264a ensures that the bonding between heat sink 264 and chamber A remains intact when for example junction box 12 is subjected to thermal stresses as a result of electronic components operating inside chamber A, high ambient heat and sunlight when junction box 12 attached to a photovoltaic panel. Where a fastener, e.g. screw is used to fasten chamber A to heat sink 264, the lateral dimensions of dovetail structure 264a is typically increased in order to accommodate the size of the fastener. A further feature of dovetail structure 264a is a hollow structure within dovetail structure 264a which allows for a deformation of dovetail structure 264a. The deformation of dovetail structure 264a allows for the different rates of thermal expansion of enclosure 102 and heat sink 264/dovetail structure 264a during the curing/cooling of the bond between heat sink 264 and enclosure 102 of chamber A.

Figure 3A:
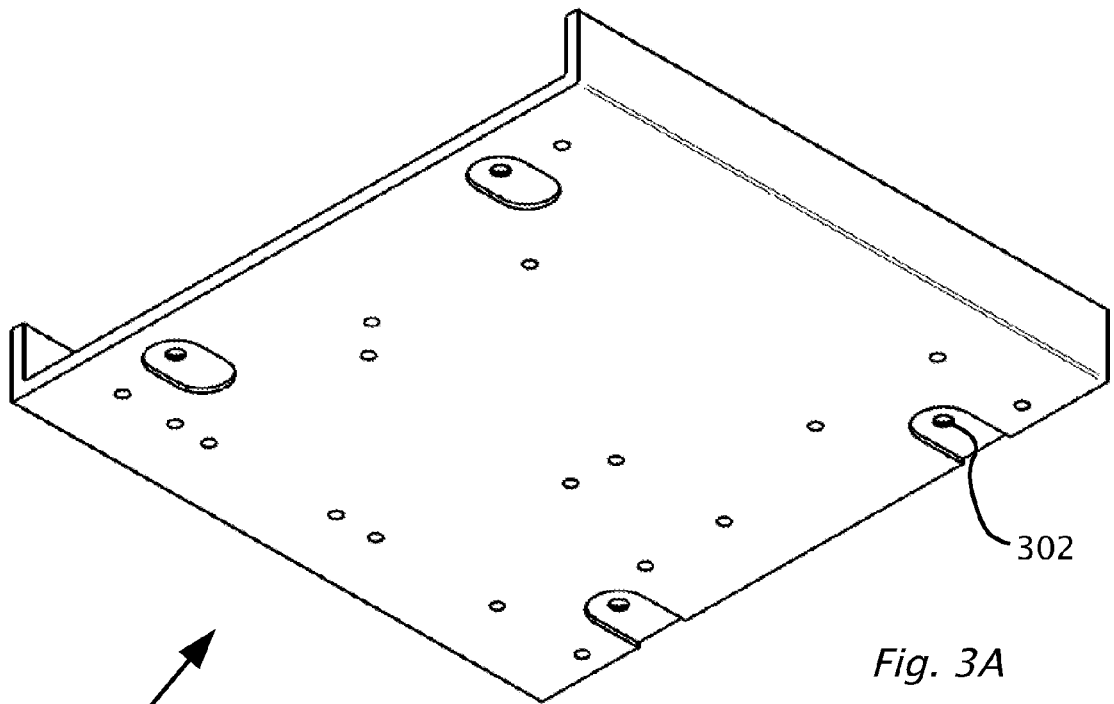
FIGS. 3A and 3B show isometric views of a heat sink according to another embodiment of the present invention.
Figure 3B:
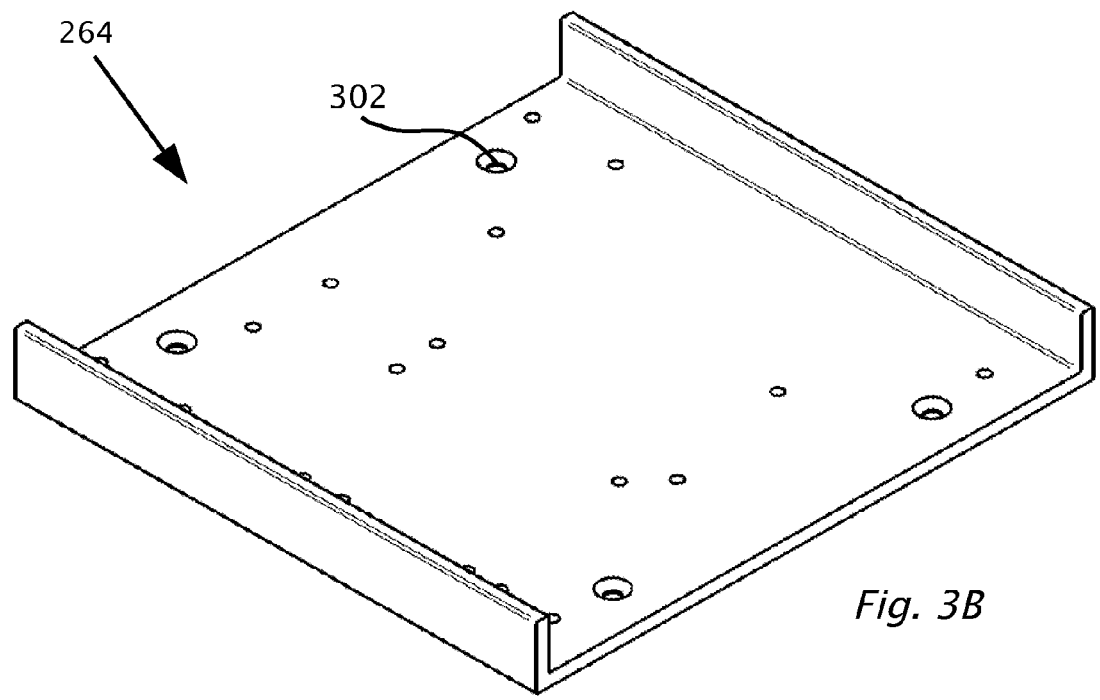

Reference is now made to FIGS. 3A and 3B which show isometric views of heat sink 264 according to another embodiment of the present invention. Heat sink 264 has four holes 302. Holes 302 are used to attach heat sink 264 into chamber A of junction box 12 using screws. The attachment of heat sink to chamber A may come as an additional step after the injection molding of junction box 12 or of a junction box 12 which is not injection molded. An additional thermal pad may be placed between heat sink 264 and enclosure 102 to ensure good contact between heat sink 264 and enclosure 102 after heat sink 264 is attached enclosure 102. The deformable nature of the thermal pad used to accommodate non-uniformity in surfaces of the heat sink 264 and enclosure 102 due to manufacturing tolerances of heat sink 264/enclosure 102. Alternatively a thermally conducting glue or potting material may be placed between heat sink 264 and enclosure 102.

The articles "a" "an" as used herein mean "one or more" such as "a heat-sink", "a circuit board" have the meaning of "one or more" that is "one or more heat-sinks" or "one or more circuit boards".

Although selected embodiments of the present invention have been shown and described, it is to be understood the present invention is not limited to the described embodiments. Instead, it is to be appreciated that changes may be made to these embodiments without departing from the principles and spirit of the invention, the scope of which is defined by the claims and the equivalents thereof.

The invention claimed is:

1. A junction box comprising:
an outer casing configured to be mounted to a photovoltaic panel;
a first chamber within the outer casing, wherein the first chamber includes a plurality of supports adapted to mount a circuit board configured to electrically convert power output from the photovoltaic panel, and wherein the outer casing includes an opening to the first chamber;
a second chamber within the outer casing, wherein the outer casing includes an opening to the second chamber, and wherein the second chamber is configured to provide an electrical connection to the photovoltaic panel;
a double wall adapted to separate the first chamber and the second chamber, wherein the double wall is adapted to allow for mutual separation and re-attachment of the first chamber to the second chamber so that the circuit board is replaceable without requiring disconnection of the second chamber from the photovoltaic panel, and wherein, when the circuit board is mounted in the first chamber, the circuit board in the first chamber is electrically connected to the electrical connection in the second chamber via a re-connectable bus bar, wherein portions of the bus bar are contained in the double wall;
a first lid adapted to seal the opening to the first chamber; and
a second lid adapted to seal the opening to the second chamber.

2. The junction box of claim 1, wherein the opening to the first chamber and the opening to the second chamber are on opposite sides of the junction box.

3. The junction box of claim 1, wherein the first lid is adapted to seal the first chamber using a first sealing process, and wherein the second lid is adapted to seal the second chamber using a second sealing process different from the first sealing process.

4. The junction box according to claim 1, wherein the first lid is adapted to seal said first chamber with a first level of hermeticity, and wherein the second lid is adapted to seal the second chamber with a second level of hermeticity different from the first level of hermeticity.

5. The junction box of claim 1, wherein the first chamber comprises the circuit board for electrically converting the power output of the photovoltaic panel.

6. The junction box of claim 1, wherein said second chamber comprises an electrical connector for the electrical connection to the photovoltaic panel.

7. The junction box of claim 1, wherein said second chamber is configured to include one or more diodes.

8. The junction box according to claim 1, wherein the second chamber further comprises one or more electrical connection terminals for connecting the circuit board to the photovoltaic panel, wherein the one or more electrical connection terminals are mounted inside said second chamber.

9. The junction box of claim 1, further comprising a metal heat sink bonded to said first chamber during manufacture of the junction box.

10. The junction box of claim 9, wherein said metal heat sink is adapted to dissipate heat generated by said circuit board.

11. The junction box of claim 9, wherein said metal heat sink is molded in the junction box during an injection mold process of manufacture of the first chamber.

12. The junction box of claim 9, wherein said metal heat sink includes a dovetail structure adapted to prevent mutual separation of said metal heat sink from said first chamber.

13. The junction box of claim 12,
wherein the dovetail structure of the metal heat sink comprises a first rate of thermal expansion,
wherein the first chamber comprises a second rate of thermal expansion different from the first rate of thermal expansion,
wherein said dovetail structure comprises a hollow structure adapted to prevent mutual separation of the metal heat sink from the first chamber during a curing of a bond between the metal heat sink and the first chamber by allowing for a deformation of a portion of the dovetail structure.

14. The junction box of claim 9, further comprising a thermal pad adapted to provide thermal conduction and electrical insulation between said circuit board and said metal heat sink.

15. The junction box according to claim 1, wherein each of the first chamber and the second chamber is manufactured by injection molding of one of acrylonitrile butadiene styrene (ABS) thermoplastic, polybutylene terephthalate (PBT), poly(p-phenylene oxide) (PPO), and a thermoset.

16. The junction box of claim 1, wherein the first chamber is a first rectangular chamber, and wherein the second chamber is a second rectangular chamber.

17. A junction box comprising:
an outer casing configured to be mounted to a photovoltaic panel;
a first chamber within the outer casing of the junction box, wherein outer casing includes an opening to the first chamber, and wherein the first chamber includes a plurality of supports adapted to mount a circuit board; and
a metal heat sink having a dovetail structure bonded to the first chamber during manufacture,
wherein the dovetail structure comprises a first rate of thermal expansion,
wherein the first chamber comprises a second rate of thermal expansion different from the first rate of thermal expansion,
wherein the dovetail structure comprises a hollow structure adapted to prevent mutual separation of the metal heat sink from the first chamber during a curing of a bond between the metal heat sink and the first chamber by allowing for a deformation of a portion of the dovetail structure, and
wherein the metal heat sink is adapted to dissipate heat generated by said circuit board.

18. The junction box of claim 17, further comprising:
a second chamber within the outer casing of the junction box, wherein the second chamber is configured to receive an electrical connection to the photovoltaic panel; and
a double wall adapted to separate the first chamber and the second chamber, wherein the double wall is further adapted to allow for mutual separation and re-attachment of the first chamber to the second chamber so that the circuit board is replaceable without requiring disconnection of the second chamber from the photovoltaic panel, and wherein, when the circuit board is mounted in the first chamber, the circuit board in the first chamber is electrically connected to the electrical connection in the second chamber via a re-connectable bus bar, wherein a portion of the bus bar is sealed in the double wall.

19. The junction box according to claim 17, wherein the first chamber is manufactured by injection molding of one of acrylonitrile butadiene styrene (ABS) thermoplastic, polybutylene terephthalate (PBT), poly(p-phenylene oxide) (PPO), and a thermoset.

20. The junction box of claim 17, wherein the first chamber is a first rectangular chamber.

21. A method comprising:
bonding a metal heat sink within a first chamber of an electrically isolated thermoplastic junction box through an injection molding process, wherein the first chamber is within an outer casing of the of electrically isolated thermoplastic junction box; and
forming a junction via a dovetail interface between the metal heat sink and the outer casing inside the first chamber.

22. The method of claim 21, wherein the dovetail interface is adapted to prevent mutual separation of the metal heat sink from the electrically isolated junction box.

23. The method of claim 22, further comprising the step of:
curing the junction between the metal heat sink and the outer casing inside the first chamber,
wherein the dovetail interface comprises a hollow structure adapted to deform during the curing to prevent the mutual separation of the metal heat sink from the electrically isolated thermoplastic junction box.

* * * * *